(12) United States Patent  
Schwarz

(10) Patent No.: US 9,509,120 B2  
(45) Date of Patent: Nov. 29, 2016

(54) OPTOELECTRONIC COMPONENT

(71) Applicant: OSRAM Opto Semiconductors GmbH, Regensburg (DE)

(72) Inventor: Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/432,109

(22) PCT Filed: Sep. 23, 2013

(86) PCT No.: PCT/EP2013/069744  
§ 371 (c)(1),  
(2) Date: Mar. 27, 2015

(87) PCT Pub. No.: WO2014/048883  
PCT Pub. Date: Apr. 3, 2014

(65) Prior Publication Data  
US 2015/0244148 A1 Aug. 27, 2015

(30) Foreign Application Priority Data  
Sep. 27, 2012 (DE) .................. 10 2012 217 652

(51) Int. Cl.  
*H01S 3/08* (2006.01)  
*H01S 5/10* (2006.01)  
(Continued)

(52) U.S. Cl.  
CPC ............. *H01S 5/1082* (2013.01); *H01S 5/005* (2013.01); *H01S 5/02252* (2013.01); *H01S 5/02288* (2013.01); *H01S 5/02296* (2013.01); *H01L 2224/48091* (2013.01); *H01L 2224/49107* (2013.01); *H01S 5/02212* (2013.01); *H01S 5/02469* (2013.01); *H01S 5/32341* (2013.01); *H01S 5/4018* (2013.01); *H01S 5/4031* (2013.01)

(58) Field of Classification Search  
CPC ............... H01S 5/005; H01S 5/02252; H01S 5/02288; H01S 5/02296; H01S 5/4018; H01S 5/4031; H01S 5/32341  
USPC ............ 372/108, 50.12, 43.01, 29.014  
See application file for complete search history.

(56) References Cited

U.S. PATENT DOCUMENTS 5,177,753 A 1/1993 Tanaka  
5,226,052 A 7/1993 Tanaka et al.  
(Continued)

FOREIGN PATENT DOCUMENTS

DE 19945131 A1 4/2001  
DE 102010056054 A1 6/2012  
(Continued)

OTHER PUBLICATIONS

Liau, Z.L., "Semiconductor wafer bonding via liquid capillarity," Applied Physics Letters, vol. 77, No. 5, Jul. 31, 2000, pp. 651-653.  
(Continued)

*Primary Examiner* — Kinam Park  
(74) *Attorney, Agent, or Firm* — Slater Matsil, LLP

(57) ABSTRACT

An optoelectronic component includes a generating device for generating electromagnetic radiation and an outcoupling device for coupling out electromagnetic radiation from the generating device. A reducing device for reducing a radiation density of the outcoupled electromagnetic radiation is arranged on a radiation output side of the outcoupling device.

18 Claims, 5 Drawing Sheets

(51) Int. Cl.
*H01S 5/022* (2006.01)
*H01S 5/00* (2006.01)
*H01S 5/024* (2006.01)
*H01S 5/323* (2006.01)
*H01S 5/40* (2006.01)

(56) References Cited

U.S. PATENT DOCUMENTS

| | | | |
|---|---|---|---|
| 6,784,511 B1 | 8/2004 | Kunihara et al. | |
| 7,565,084 B1* | 7/2009 | Wach | H04J 14/04 398/183 |
| 2003/0007257 A1* | 1/2003 | Bell, Jr. | H01S 5/0267 359/719 |
| 2003/0037874 A1 | 2/2003 | Liau et al. | |
| 2008/0043798 A1 | 2/2008 | Calvez et al. | |
| 2011/0180838 A1* | 7/2011 | Sasaoka | B82Y 20/00 257/99 |

FOREIGN PATENT DOCUMENTS

| | | |
|---|---|---|
| JP | 2003059087 A | 2/2003 |
| JP | 2012178434 A | 1/2012 |

OTHER PUBLICATIONS

Sinha, S., et al., "Investigation of the suitability of silicate bonding for facet termination in active fiber devices," Optics Express, vol. 15, No. 20, Oct. 1, 2007, pp. 13003-13022.

* cited by examiner

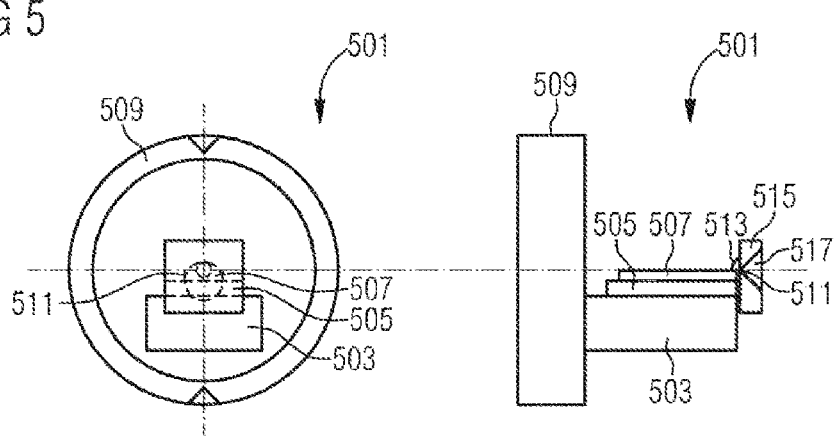
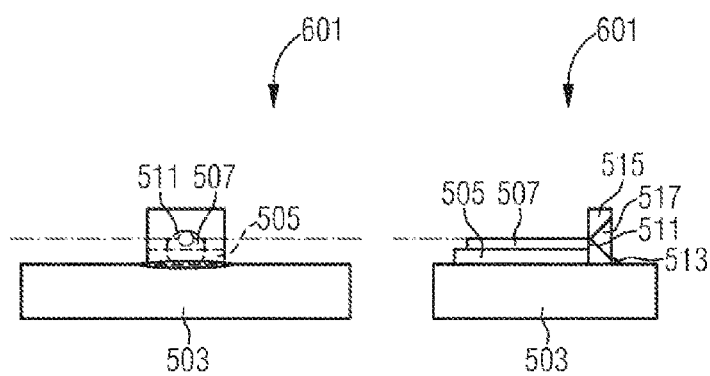

OPTOELECTRONIC COMPONENT

TECHNICAL FIELD

The invention relates to an optoelectronic component and to a method for producing an optoelectronic component.

BACKGROUND

The published patent application DE 10 2010 056 054 A1 discloses a method for producing a plurality of laser bars, and laser bars and laser diodes.

SUMMARY

Embodiments of the invention provide an optoelectronic component. While other embodiments provide a method for producing an optoelectronic component.

According to one aspect, an optoelectronic component is provided. The component comprises a generating device for generating electromagnetic radiation. Furthermore, the component comprises a coupling-out device for coupling out electromagnetic radiation from the generating device. A reducing device for reducing a radiance of the coupled-out electromagnetic radiation is arranged on a radiation exit side of the coupling-out device.

In accordance with a further aspect, a method for producing an optoelectronic component is provided. A generating device for generating electromagnetic radiation and a coupling-out device for coupling out electromagnetic radiation from the generating device are provided. A reducing device for reducing a radiance of the coupled-out electromagnetic radiation is arranged on a radiation exit side of the coupling-out device.

The invention therefore encompasses in particular the concept of reducing a radiance of the coupled-out electromagnetic radiation by arranging a reducing device on the radiation exit side of the coupling-out device. That is to say, therefore, in particular, that the reducing device is connected, that is to say in particular directly or indirectly connected, to the coupling-out device by means of the radiation exit side. Directly connected means, in particular, that the reducing device is connected directly to the radiation exit side, that is to say in particular is in direct contact therewith. Indirectly connected means, in particular, that the reducing device is connected indirectly to the radiation exit side, that is to say is not in direct but rather in indirect contact therewith. By way of example, one element or a plurality of elements such as an intermediate layer or an adhesive layer can be provided which are situated between the reducing device and the radiation exit side and connect the radiation exit side to the reducing device.

What is advantageously brought about by reducing the radiance is that damage caused by radiation can be avoided. Such damage caused by radiation can arise, for example, on account of excessively high radiances by virtue of the fact that substances, in particular gaseous substances such as short-chain hydrocarbons, for example, which drift past in front of the radiation exit side are decomposed on account of the high radiance. The decomposed substances then generally settle or deposit on the radiation exit side and can impede emergence of radiation there. That is to say, therefore, in particular, that an emitted power can decrease as time goes by, on account of an increase in the deposits.

These decomposition processes can advantageously be prevented by virtue of the radiance being reduced by means of the reducing device. Therefore, fewer to no decomposition processes take place, and so an emitted radiation power remains substantially constant even as time goes by. A lifetime of the optoelectronic component is thus advantageously lengthened considerably.

In general, it is indeed possible that optoelectronic component are inserted into a hermetically sealed housing, which can be evacuated, for example. On account of the resultant reduced density of substances in the housing that might be decomposed, a reduction of deposits can usually also be brought about as a result. However, this is costly and technically complex. Additional materials are needed, here in particular the housing and seals. Furthermore, such housings which can hermetically seal an optoelectronic component from an environment are expensive and technically complex to produce. In particular, it is a complex matter to realize an electrical feedthrough for making electrical contact with the component, without adversely affecting the impermeability. Furthermore, in general no organic outgassing substances are permitted to be used in such hermetic housings. That means, in particular, that adhesives, for example, cannot be used. The latter, however, are generally expedient in comparison with other fixing means, and so the costs and manufacturing complexity are increased owing to the provision of a hermetic housing and the resultant dispensing with expedient adhesives.

The above-mentioned disadvantages are avoided by means of the reducing device, in so far as such a hermetic housing with the associated disadvantages can be dispensed with. In other words, it is no longer necessary to insert the optoelectronic component into a hermetically sealing housing. The reduction of the radiance is brought about by means of the reducing device, such that decomposition processes can no longer occur or they are at least considerably reduced to a harmless level.

In accordance with one embodiment, it can be provided that the coupling-out device has a coupling-out facet and the reducing device comprises an optical element, in particular a window, wherein the optical element is arranged in a manner at least partly covering, in particular completely covering, the radiation exit side.

That is to say, therefore, in particular, that an optical element, in particular a window, is used in order to at least partly, in particular wholly, cover the coupling-out facet. The coupled-out electromagnetic radiation generally emerges from the generating device through said coupling-out facet. That is to say, therefore, in particular, that the coupled-out electromagnetic radiation firstly radiates through the optical element before it can interact with the environment, in particular with the particles or substances situated in the environment. Since an intensity of the radiance generally decreases with a distance from the coupling-out device, here in particular from the coupling-out facet, which can be brought about in particular on account of a divergent beam cone, the optical element has the effect that the radiance is sufficiently reduced when the electromagnetic radiation emerges again from the optical element. The electromagnetic radiation then has a sufficiently reduced radiance, such that decomposition processes can no longer be induced on substances or particles in the environment.

Since the optical element at least partly covers the radiation exit side, encompasses in particular the cases where the optical element directly covers and indirectly covers the radiation exit side. Directly covers in the sense of the present invention means, in particular, that the optical element is fitted or arranged directly at the coupling-out facet, that is to say at the radiation exit side. In other words, in particular no intermediate layer is provided between the coupling-out facet and the optical element. Indirectly in the sense of the present invention means, in particular, that one further element or further elements, for example, further optical layers and/or adhesive layers, can additionally be arranged between the radiation exit side and the optical element. Said further elements connect the coupling-out facet and the optical element to one another.

The reducing device, here in particular the optical element, advantageously brings about a lengthening of a coupling-out path of the electromagnetic radiation from the generating device before this can interact with an environment of the component. Via this lengthened coupling-out path, a radiance generally decreases on account of the divergent beam, such that the radiance is sufficiently reduced when the radiation or the beam emerges from the optical element.

The reducing device, in particular the optical element, furthermore advantageously brings about protection for the coupling-out facet, such that no substances or particles can be arranged at the latter. If necessary, for example, if the reducing device should no longer fulfill specific optical specifications, the reducing device can be exchanged without the generating device, in particular the laser diode, having to be exchanged.

The reducing device, preferably the optical element, can preferably be arranged releasably at the coupling-out facet. Preferably, an adhesive that adhesively bonds the reducing device, in particular the optical element, to the coupling-out facet and/or to further elements such as a carrier, for example, is removed in order to release the reducing device, in particular the optical element, from the coupling-out facet and/or from the further elements.

A facet in the sense of the present invention denotes, in particular, a smooth interface. Smooth means here, in particular, that a surface roughness of the facet is significantly smaller than a wavelength of the emitted electromagnetic radiation. Preferably, said surface roughness is smaller than half of the wavelength, particularly preferably smaller than one quarter of the wavelength. The facet therefore forms, in particular, an interface or a side face of the coupling-out device. If the optoelectronic component is surrounded, for example, by air or some other material having a lower optical refractive index than the refractive index of the material of the coupling-out facet, then the electromagnetic radiation generated by means of the generating device can be partly reflected at the coupling-out facet/air interface.

In accordance with one embodiment, it can be provided that the generating device comprises a laser diode. Preferably, the generating device comprises a laser diode that emits in the wavelength range of less than 460 nm. Electromagnetic radiation having a wavelength of less than 460 nm is generally designated as blue electromagnetic radiation. Consequently, such a laser diode can also be designated as a blue laser diode. In particular, the laser diode emits in a wavelength range of between 100 nm and 380 nm. Radiation in this wavelength range between 100 nm and 380 nm can also be designated as ultraviolet (UV) radiation. A corresponding laser diode can preferably be designated as a UV laser diode.

Since such a blue or UV laser diode emits particularly high-energy electromagnetic radiation, in particular, decomposition processes are particularly common here on account of the high radiance, for example, up to 10 000 W/mm². It is therefore particularly important for an optoelectronic component comprising a blue or UV laser diode to be protected particularly well against such decomposition processes. This is brought about on account of the reduction of the radiance of the emitted laser radiation. In particular, this is brought about by the optical element being arranged or mounted in front of or at the coupling-out facet.

In the case of a laser diode, the electromagnetic radiation can also be designated as laser radiation. The coupling-out facet can also be designated as an exit facet of the laser diode or generally as a laser facet. The laser facet is therefore, in particular, part of the coupling-out device therefore also part of the generating device.

According to one embodiment, the laser diode can have two facets respectively situated opposite one another. These two facets form a resonator for the laser diode, wherein the laser radiation generated by means of the laser diode can be coupled out, in particular can be at least partly coupled out, from the resonator via the exit facet or the coupling-out facet or laser facet.

According to one embodiment, the optical element has a predetermined thickness in the emission direction, which is chosen in particular such that at the optical exit plane of the optical element the radiance, in particular the laser radiance, is reduced to such an extent that decompositions and resultant deposits can no longer occur. A reduction of the radiance can take place here in particular by virtue of the divergent beam, in particular laser beam, such as emerges from the laser diode.

According to a further embodiment, it can be provided that the optical element has an antistick layer on its surface in order to avoid deposits on the optical element. Such an antistick layer can comprise polytetrafluoroethylene, for example. Therefore, if decomposition processes and resultant deposits arise to a small extent despite a reduced radiance, then said deposits can be reduced or even avoided by means of the antistick layer. Even if decomposition processes no longer occur, nevertheless—on account of the substances generally present in an environment—deposits of said substances on the optical element can take place. This, too, is advantageously avoided, at least reduced, by the provision of an antistick layer.

In accordance with one embodiment, it can be provided that the optical element has a fluid-impermeable protective layer. A fluid in the sense of the present invention denotes, in particular, a gas or a liquid. The provision of such a protective layer advantageously protects the optical element against the penetration of a fluid. In this regard, it is possible, in particular, to use such an optoelectronic component even in environmental conditions having an increased air humidity. Since, in general, even normal air humidity (for example: 30% relative air humidity at 20° C.) can lead to problems, in particular in the case of blue laser diodes, a lengthening of lifetime in normal environmental conditions (normal air humidity) can also already be brought about on account of the protective layer.

The protective layer preferably encloses the optical element, for example, a plane plate, and an adhesive between the optical element and the radiation exit side, in particular the facet, and preferably further parts, in particular the laser diode, of the component in order to obtain a corresponding impermeability.

Generally, a lifetime of a corresponding optoelectronic component is advantageously increased considerably by the provision of such a protective layer or an antistick layer.

In accordance with one embodiment, it can be provided that the optical element comprises a material from the following group of materials:

Silicon oxide, aluminum oxide, sodium oxide, potassium oxide, magnesium oxide, calcium oxide, boron oxide, lead oxide, sapphire, gallium nitride, silicone and polymer.

In accordance with a further embodiment, it can be provided that the optical element is wrung on the radiation exit side. In this case, the optical element is in particular in direct contact with the radiation exit side, such that the optical element still acts like a protective cap for the radiation exit side.

According to one embodiment, it can be provided that the optical element is fixed against a displacement parallel to the radiation exit side. Preferably, it can be provided that the wrung-on optical element is fixed against a displacement parallel to the radiation exit side. In the case of a wrung-on optical element, in particular, this fixing is particularly advantageous since wringing on the optical element generally has the effect that the optical element is fixed to the radiation exit side in a direction perpendicular to the radiation exit side, but is not sufficiently fixed against a displacement parallel to the radiation exit side. This possible disadvantage is overcome by means of the fixing.

In accordance with one embodiment, it can be provided that the coupling-out device has a coupling-out facet and the reducing device comprises an optical element, wherein the optical element is arranged in a manner at least partly covering, in particular completely covering, a radiation exit side of the coupling-out facet the radiation exit side.

In a further embodiment, it can be provided that the coupling-out facet is wrung onto the radiation exit side.

In a further embodiment, it can be provided that wringing the optical element on the radiation exit side comprises applying a fluid, in particular a liquid or a gas, to the radiation exit side, pressing, which can also be designated in particular as pressing-on, the optical element onto the radiation exit side with the applied fluid, and evaporating the applied fluid, such that after the evaporation of the applied fluid the optical element is pulled and held against the radiation exit side by means of atomic forces. As long as the fluid has not yet completely evaporated, a capillary force additionally acts, too, which pulls and holds the optical element against the radiation exit side. Owing to the use of the fluid, an angular alignment (plane-parallel) of optical element and radiation exit side (in particular facet) can advantageously take place in a self-adjusting manner during evaporation. In this respect, in particular, a mechanically complex adjusting device can advantageously be dispensed with.

Such wringing is particularly advantageous since further fixing means such as adhesives, for example, can be dispensed with. A generally sufficient fixing is brought about here by means of the capillary force.

If necessary, in accordance with a further embodiment, it can be provided that the optical element, after pressing-on, which can also be designated in particular as pressing, is fixed against a displacement parallel to the surface of the radiation exit side. By way of example, an adhesive can be used for such a fixing. Said adhesive can be applied, for example, in an edge region of the radiation exit side, such that it does not lie in the direct beam cone of the emitted electromagnetic radiation.

According to one embodiment, it can be provided that the optical element is soldered on the radiation exit side or is soldered with the latter. Such a fixing brings about a particularly mechanically stable connection between the optical element and the radiation exit side. In this respect, such an optoelectronic component can advantageously be used even in harsh environments.

According to one embodiment, it can be provided that the optical element is soldered with the radiation exit side. Preferably, it can be provided that the radiation exit side is metallically coated and a solder is applied on a surface of the optical element situated opposite the radiation exit side, in order to solder the radiation exit side with the optical element. In particular, it can be provided that the surface of the optical element situated opposite the radiation exit side is metallically coated and a solder is applied to the radiation exit side in order to solder the radiation exit side with the optical element.

Preferably, the solder used is a thin-layer solder, for example, AuGe, AuSn, Sn or In, in particular having a thickness of between 2 µm and 5 µm. In particular, the solder used is a paste solder, in particular having a thickness of between 30 µm and 70 µm.

According to one embodiment, the solder used can be a paste solder, for example, SnAgCu. That is to say that paste soldering is carried out.

In accordance with a further embodiment, it can be provided that the optical element is adhesively bonded on the radiation exit side. Such a fixing advantageously causes the optical element to be fixed to the radiation exit side particularly stably. Furthermore, the use of adhesives is particularly cost-effective and technically simple to realize. Consequently, a corresponding optoelectronic component is simple and cost-effective to produce.

The adhesive used can be, for example, a polymer, in particular a curable polymer.

In accordance with one embodiment, it can be provided that the optical element is adhesively bonded onto the radiation exit side.

According to one embodiment, it can be provided that epoxy and/or acrylates and/or silicone are/is used as the adhesive. Silicone, in particular, is preferably suitable since it has a high UV light durability. Consequently, it is advantageously possible to prevent the adhesive, that is to say here the silicone, from becoming maned in the beam path over the lifetime of the component.

Preferably, adhesive bonding comprises at least partly filling a gap between the radiation exit side and the optical element with an adhesive, in particular a curable polymer. When a curable polymer is used, adhesive bonding additionally comprises a step of curing the polymer. Preferably, curing the polymer comprises exposing the polymer to UV light. In particular, it can be provided that curing the polymer comprises increasing an ambient temperature of the polymer. By providing UV light and/or an increased ambient temperature, it is advantageously possible for a curing process to be accelerated considerably, with the result that a production time of a corresponding optoelectronic component can be reduced considerably.

In a different embodiment, it can be provided that the fixing possibilities mentioned above and described below can be arbitrarily combined with one another. In particular, soldering and adhesive bonding can be provided. A particularly mechanically stable fixing is brought about as a result.

In accordance with one embodiment, it can be provided that the optical element has an antireflection layer. Such an antireflection layer advantageously reduces or avoids reflections of the coupled-out electromagnetic radiation. Such antireflection layers can be formed from one layer, for example. In particular, such antireflection layers can be formed from a plurality of layers, that is to say from a layer sequence. Such layers can comprise, for example, silicon oxide, tantalum oxide, titanium oxide or a combination of the aforementioned materials. Preferably, a layer thickness for an antireflection layer, in particular for a monolayer antireflection layer, is lambda/4 nm, wherein lambda denotes the wavelength of the emitted electromagnetic radiation.

For a wavelength of less than 400 nm, a layer thickness in this respect can be between 50 nm and 100 nm, for example.

In accordance with one embodiment, it can be provided that the fluid-impermeable protective layer comprises a silicon oxide, an aluminum oxide or a combination of the two aforementioned materials. Preferably, the aforementioned materials or else only one of the aforementioned materials are/is applied to an organic material such as a polymer, for example, in particular as one or a plurality of atomic layers. Preferably, the fluid-impermeable protective layer can comprise a parylene. The aforementioned polymers and materials can be applied or deposited in particular by means of deposition methods such as plasma-enhanced chemical vapor deposition methods, for example.

According to one embodiment, it can be provided that the individual layers such as, for example, protective layer, antireflection layer or antistick layer of the optical element are connected to one another, such that a layer composite assembly comprising a plurality of layers is formed. It can preferably be provided that the individual layers are connected by means of thermal bonding. Preferably, the layers can be metalized, such that soldering of the layers is subsequently possible, for example, in a wafer composite assembly. If a composite assembly composed of glass-silicon-glass is used, this can be produced by means of anodic bonding, in particular. In this case, radiation is generally not transmitted through the silicon, rather the silicon serves for fixing purposes. Cavities in the glass can be produced by wet-chemical etching, for example. This can be done very cost-effectively, in particular.

In accordance with one embodiment, it can be provided that a thickness of the optical element in the emission direction is a plurality of 1/10 mm to a few mm. Preferably, a shape of the optical element can be planar. In particular, the optical element can have a lens shape, in particular a concave lens shape, such that a collimation of the coupled-out electromagnetic radiation can advantageously be brought about.

The provision of a layer composite assembly or of a layer sequence for the optical element advantageously has the effect that special and specific optical properties can be defined, depending on the specific application. In this regard, by way of example, beam expansion can take place in the optical element in order to arrive at lower power densities of the emitted electromagnetic radiation even with relatively short thicknesses in the emission direction.

According to one embodiment, it can be provided that the shape of the optical element is a lens surface, a freeform surface or a hemisphere.

According to one embodiment, it can be provided that a resonant behavior of the laser diode is checked after the process of arranging the reducing device. It is thus advantageously possible to check whether a coupled resonator, which can adversely influence the resonant behavior of the laser, has arisen owing to the provision of the reducing device.

According to one embodiment, a carrier is provided, on which a heat sink, in particular, is arranged. In particular the generating device, in particular the laser diode, is arranged on the heat sink. The laser diode is preferably a blue laser diode or a UV laser diode. The provision of the heat sink advantageously has the effect that the heat generated during the operation of the laser diode can be dissipated, with the result that overheating of the laser diode can advantageously be avoided.

The carrier is preferably arranged on a transistor housing, which can encompass, for example, electronic components for driving the generating device, in particular the laser diode.

In one embodiment, it can be provided that the optical element is wrung on the coupling-out facet. That is to say, therefore, in particular, that the optical element is in direct contact with the coupling-out facet. In order to fix the optical element further, in particular in order to fix it in a direction parallel to the coupling-out facet plane, an adhesive is preferably provided which adhesively bonds the optical element to the carrier. That is to say, therefore, in particular, that adhesive is provided between the optical element and the carrier and adhesively bonds the optical element to the carrier.

It can therefore be provided, in particular, that the optical element is wrung onto the coupling-out facet, wherein the optical element is subsequently adhesively bonded onto the carrier by means of adhesive. Consequently, a displacement of the optical element in a direction perpendicular to the facet plane and also a displacement parallel to the facet plane are advantageously brought about.

In a different embodiment, it can be provided that the optical element is adhesively bonded both on the carrier and on the coupling-out facet by means of adhesive. A particularly stable arrangement is advantageously brought about as a result.

BRIEF DESCRIPTION OF THE DRAWINGS

The invention is explained in greater detail below on the basis of preferred exemplary embodiments. In this case:

FIG. 5 shows an optoelectronic component;
FIG. 6 shows another optoelectronic component.

Identical reference signs can be used for identical features hereinafter.

DETAILED DESCRIPTION OF ILLUSTRATIVE EMBODIMENTS

Figure 1:
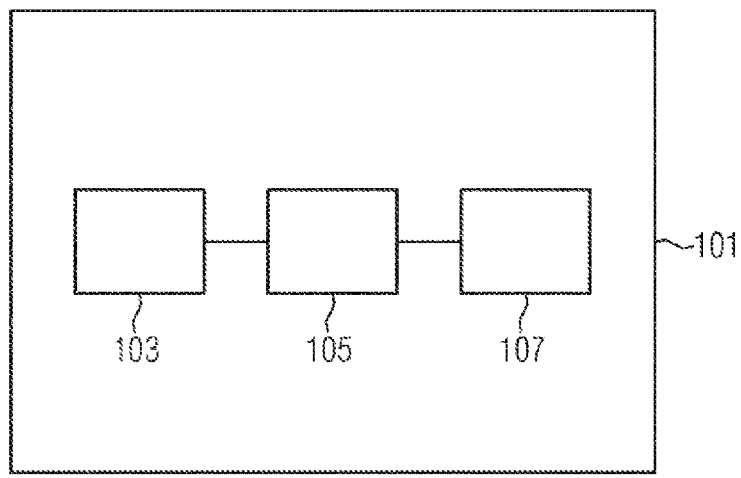
FIG. 1 shows an optoelectronic component.

FIG. 1 shows an optoelectronic component 101.

The component 101 comprises a generating device 103 for generating electromagnetic radiation. The generating device 103 can comprise a laser diode, for example, which preferably emits laser radiation having a wavelength of less than 460 nm, in particular less than 380 nm.

The component 101 furthermore comprises a coupling-out device 105, which is designed to couple out the electromagnetic radiation from the generating device. The coupling-out device can comprise a coupling-out facet, for example. Preferably, the coupling-out facet forms one of the two facets of a resonator in the case of a laser diode.

The optoelectronic component 101 furthermore comprises a reducing device 107 for reducing a radiance of the coupled-out electromagnetic radiation, wherein the reducing device 107 is arranged on a radiation exit side of the coupling-out device 105.

Reducing the radiance advantageously has the effect of preventing or reducing decomposition processes at gaseous substances such as short-chain hydrocarbons, for example, which are situated in the environment of the coupling-out device, with the result that correspondingly decomposed substances cannot deposit on the coupling-out device, in particular the coupling-out facet.

Figure 2:
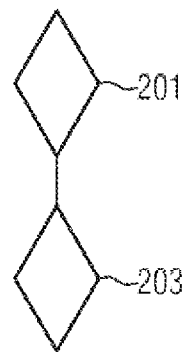
FIG. 2 shows a flow diagram of a method for producing an optoelectronic component.

FIG. 2 shows a flow diagram of a method for producing an optoelectronic component.

A step 201 involves providing a generating device for generating electromagnetic radiation and a coupling-out device for coupling out electromagnetic radiation from the generating device. A step 203 involves arranging a reducing device for reducing a radiance of the coupled-out electromagnetic radiation on a radiation exit side of the coupling-out device.

Figure 3:
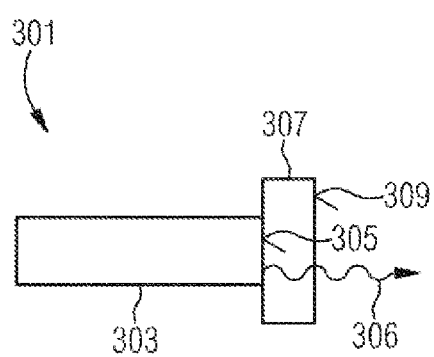
FIG. 3 shows a further optoelectronic component.

FIG. 3 shows a further optoelectronic component 301.

The component 301 comprises a laser diode 303, which emits laser radiation in the wavelength range of less than 460 nm, in particular less than 380 nm. The laser diode 303 comprises a laser facet 305, by means of which laser radiation can be coupled out from the laser diode 303. The coupled-out laser radiation is represented symbolically here by means of a wavy arrow bearing the reference sign 306. An optical element 307 is arranged at the laser facet 305.

The optical element 307 advantageously brings about, in particular, a lengthening of a coupling-out path or of a coupling-out section of the coupled-out laser radiation 306, such that the latter reduces its radiance over the lengthened coupling-out section. That is to say, therefore, in particular, that at an optical exit plane 309 of the optical element 307 the radiance is reduced in comparison with the radiance of the coupled-out laser radiation 306 directly at the laser facet 305.

Since the laser radiation is generally coupled out from the laser diode 303 in the form of a divergent laser beam, the radiance is reduced in particular by the divergent laser beam or on account of the expansion thereof.

Figure 4:
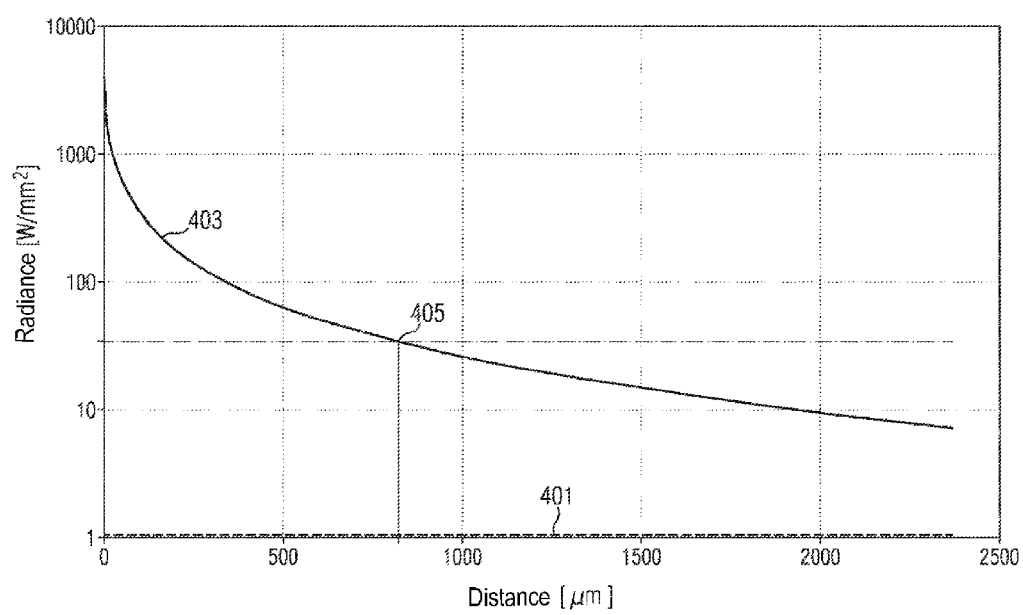
FIG. 4 shows a profile of a radiance in air against a distance from the coupling-out device.

FIG. 4 shows a dependence of a radiance of a laser beam in air against a distance relative to a laser facet.

There is plotted on the abscissa the distance in the emission direction in micrometers relative to the radiation exit side, here the laser facet, that is to say the distance perpendicularly from the radiation exit side.

The radiance in air in W/mm$^2$ is plotted on the ordinate.

The curve bearing the reference sign 401 identifies a corresponding profile of a light emitting diode.

The curve bearing the reference sign 403 identifies a corresponding profile of a laser diode that emits blue laser radiation, in particular UV radiation. The point identified by the reference sign 405 in the curve marks the point at which a radiance has fallen to a tolerable level, such that decomposition processes can largely no longer occur, such that corresponding deposits can no longer happen or occur.

FIG. 5 shows an optoelectronic component 501 in a front view (left) and a side view (right).

The optoelectronic component 501 comprises a carrier 503, on which a heat sink 505 is arranged. A laser diode 507 is arranged on the heat sink 505. The laser diode 507 is preferably a blue laser diode or a UV laser diode. The provision of the heat sink 505 advantageously has the effect that the heat generated during the operation of the laser diode 507 can be dissipated, such that overheating of the laser diode 507 can advantageously be avoided.

The carrier 503 is furthermore arranged on a transistor housing 509, which can encompass, for example, electronic components for driving the laser diode 507.

The laser diode 507 furthermore comprises a laser facet 511 as coupling-out facet for the laser radiation generated by means of the laser diode 507.

Furthermore, a window 515 as optical element is provided, which is adhesively bonded on the laser facet 511 by means of an adhesive 513. The adhesive 513 is preferably an adhesive that is radiation-transmissive to the laser radiation.

That is to say, therefore, in particular, that the adhesive 513 is applied directly on the laser facet 511, wherein the window 515 is arranged directly on the adhesive 513. As a result, a coupling-out section for the laser light is advantageously lengthened, such that after said coupling-out section said light is expanded widely enough, such that the corresponding radiance is reduced enough to avoid decomposition processes. An emission cone of the laser light is identified here by the reference sign 517.

FIG. 6 shows a further optoelectronic component 601.

The optoelectronic component 601 is constructed substantially analogously to the optoelectronic component 501 in accordance with FIG. 5. Reference can be made to the corresponding explanations. The transistor housing 509 is not shown, for the sake of clarity.

It is noted that, in an embodiment that is not shown, very generally provision can be made for the optoelectronic component not to comprise such a transistor housing. That is to say, therefore, in particular, that the optoelectronic component per se is also disclosed without a transistor housing.

As a difference in comparison with the optoelectronic component 501 in accordance with FIG. 5, the window 515 is wrung on the laser facet 511 in the optoelectronic component 601 in accordance with FIG. 6. That is to say, therefore, in particular, that the window 515 is in direct contact with the laser facet 511. In order to fix the window 515 further, in particular in order to fix it in a direction parallel to the laser facet plane, an adhesive 513 is provided which adhesively bonds the window 515 onto the carrier 503. That is to say, therefore, in particular, that adhesive 513 is provided between the window 515 and the carrier 503 and adhesively bonds the window 515 onto the carrier 503.

It can therefore be provided, in particular, that the window 515 is wrung onto the laser facet 511, wherein the window 515 is subsequently adhesively bonded onto the carrier 503 by means of adhesive 513. Consequently, a displacement of the window 515 in a direction perpendicular to the laser facet plane and also a displacement parallel to the laser facet plane are advantageously brought about.

Figure 7:
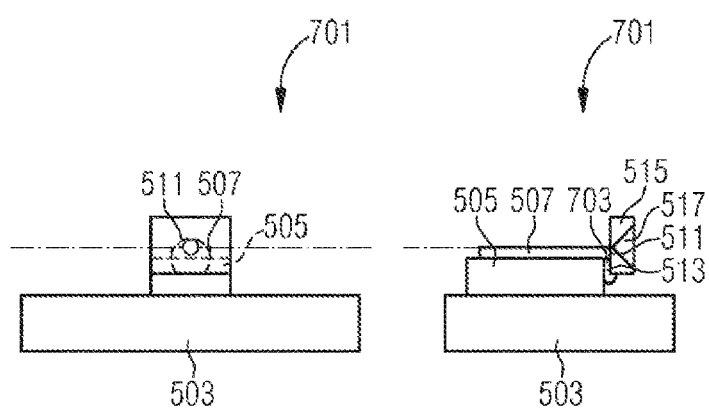
FIG. 7 shows another optoelectronic component.

FIG. 7 shows another optoelectronic component 701.

The optoelectronic component 701 is constructed substantially analogously to the optoelectronic components 501 and 601 in accordance with FIGS. 5 and 6. Reference can be made to the corresponding explanations.

In the optoelectronic component 701, too, the window 515 is wrung on the laser facet 511. As a difference with respect to the optoelectronic components 501 and 601, in the optoelectronic component 701 it is provided that adhesive 513 is provided between the window 515 and the heat sink 505 and adhesively bonds the window 515 onto the heat sink 505.

For this purpose, the laser diode 507 projects with its laser facet 511 beyond the heat sink 505 for a predetermined distance. If the window 515 is then wrung onto the laser facet 511, a gap 703 is formed between the wrung-on window 515 and the heat sink 505 on account of this projection. Adhesive 513 is then introduced or applied in said gap 703, such that an adhesive fixing of the window 515 with the heat sink 505 is brought about.

Figure 8:
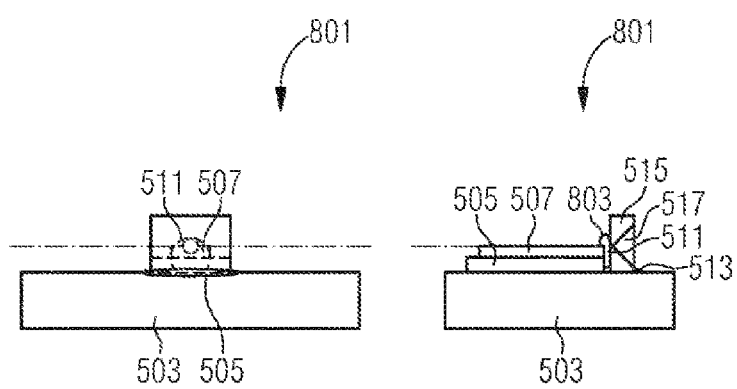
FIG. 8 shows a further optoelectronic component.

FIG. 8 shows another optoelectronic component 801. The optoelectronic component 801 is constructed substantially analogously to the optoelectronic components 501, 601 and 701 in accordance with FIGS. 5, 6 and 7. Reference can be made to the corresponding explanations.

The window 515 of the optoelectronic component 801 is adhesively bonded onto the carrier 503 by means of an adhesive 513. Furthermore, the window 515 is adhesively bonded onto the laser facet 511 of the laser diode 507 by means of a further adhesive 803, that is to say, therefore, in particular, that the window 515 is adhesively bonded twice: firstly with the laser facet 511 and secondly with the carrier 503. A particularly secure fixing of the window 515 relative to the laser facet 511 is brought about as a result.

Figure 9:
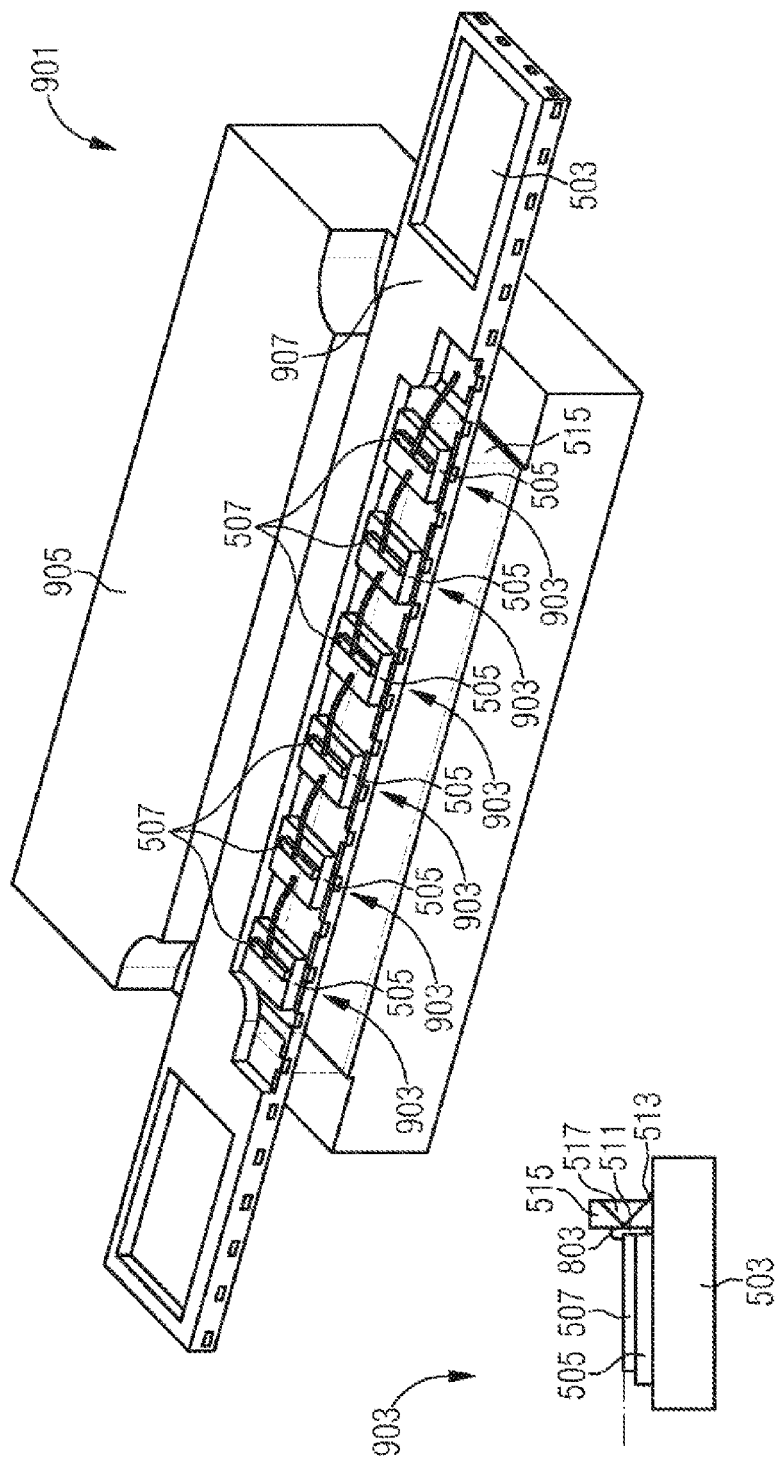
FIG. 9 shows an optoelectronic system comprising a plurality of optoelectronic components.

FIG. 9 shows an optoelectronic system 901.

The optoelectronic system 901 comprises a plurality of optoelectronic components 903 arranged parallel alongside one another. One such optoelectronic component 903 is shown in a side view on the left. The drawing on the right shows a plan view of the optoelectronic system 901 obliquely from above.

The optoelectronic components 903 are constructed analogously to the optoelectronic component 801 in accordance with FIG. 8. Reference can be made to the corresponding explanations.

In an embodiment that is not shown, provision can be made for the optoelectronic components 903 to be constructed in each case analogously to the optoelectronic components 501, 601, 701. The optoelectronic components of the system 901 can be formed in particular identically or preferably differently.

In the optoelectronic system 901, the optoelectronic components 903 share a common window 515. That is to say, therefore, in particular, that a single window 515 is provided, which as optical element is adhesively bonded on the respective laser facets 511 of the individual laser diodes 507 by means of adhesive 803. The single window 515 is furthermore arranged on a common carrier 503 by means of adhesive 513. That is to say, therefore, in particular, that the components 903 share a common carrier. In this case, it is furthermore provided that the common carrier 503, onto which the individual laser diodes 507 are arranged by means of a respective heat sink 505, is thermally connected to a further heat sink 905. In particular, the common carrier 503 is arranged on the heat sink 905.

The heat sink 905 has a stepped shape in accordance with FIG. 9, wherein the common carrier 503 is arranged on the lower step of the heat sink 905. In further embodiments (not shown), it can be provided that the heat sink 905 has a level or planar shape, that is to say does not have a stepped shape.

The common carrier 503 is furthermore arranged in a frame 907 composed of epoxy resin, for example, which can bring about mechanical protection and mechanical stabilization of the common carrier 503. The frame 907 can be enclosed, for example, by means of a thermoplastic and/or by means of a thermosetting plastic before the individual laser diodes 507 are mounted. In particular, in an embodiment that is not shown, it can be provided that such an epoxy frame 907 is dispensed with.

To summarize, therefore, the invention encompasses the concept, in particular, of reducing the luminance of a blue or UV laser diode by mounting an optical element directly in front of the exit facet of the laser diode. This reduction is therefore brought about in particular by means of the optical element, wherein a thickness in the emission direction, that is to say in particular in a direction perpendicular to the exit facet, is chosen in particular such that at the optical exit plane thereof the radiance is reduced to an extent such that decompositions and deposits can no longer occur. In this case, the radiance is reduced in particular by the divergent laser beam. That is to say, therefore, in particular, that the optical element brings about a lengthening of a coupling-out section.

The optical element can be formed from or comprise in particular an optical glass, silicon dioxide, sapphire ($Al_2O_3$), gallium nitride (GaN), silicone and/or a polymer, in particular a radiation-stable polymer, or can respectively be formed from a combination of the aforementioned materials or comprise such a combination.

In particular, it can be provided that the material of the optical element has a high transmission at the corresponding laser wavelength and/or a high substance impermeability to gas and liquids, that is to say fluids.

Preferably, the optical element has coatings in order in particular to suppress reflections or to reduce deposits of substances. Preferably, a shape of the optical element can be a planar plate. The shape can be in particular a lens surface, preferably a free form surface, in particular a hemisphere.

The optical element can preferably consist of or be formed from more than one material or more than one layer, such that, for example, a layer composite assembly can be formed from two plates, wherein the layer composite assembly then forms the optical element. This has the effect, in particular, that specific optical properties can be defined. By way of example, beam expansion can be brought about in the optical element in order to arrive at lower power densities with shorter thicknesses. That is to say, therefore, in particular, that the optical element is designed to expand the laser beam or generally the emitted electromagnetic radiation.

In an embodiment that is not shown, it can furthermore be provided that after the optical element has been mounted, a check is made to determine how the optical element affects the resonant behavior of the laser. In particular, a check is made to determine whether a coupled resonator has formed.

Although the invention has been more specifically illustrated and described in detail by means of the preferred exemplary embodiments, nevertheless, the invention is not restricted by the examples disclosed, and other variations can be derived therefrom by the person skilled in the art, without departing from the scope of protection of the invention.

The invention claimed is:

1. An optoelectronic component comprising:
a light-emitting device configured to generate electromagnetic radiation;
a coupling-out device configured to couple out electromagnetic radiation from the light-emitting device; and
a reducing device comprising an optical element, the reducing device configured to reduce a radiance of the coupled-out electromagnetic radiation, wherein the reducing device is arranged on a radiation exit side of the coupling-out device, wherein the optical element has a fluid-impermeable protective layer, and wherein the protective layer protects the optical element against a penetration by a fluid.

2. The optoelectronic component as claimed in claim 1, wherein the coupling-out device has a coupling-out facet, and wherein the optical element at least partly covers the radiation exit side.

3. The optoelectronic component as claimed in claim 2, wherein surfaces of the optical element have an antistick layer in order to avoid deposits on the optical element.

4. The optoelectronic component as claimed in claim 1, wherein the fluid-impermeable protective layer is a gas-impermeable protective layer.

5. The optoelectronic component as claimed in claim 2, wherein the optical element is wrung on the radiation exit side.

6. The optoelectronic component as claimed in claim 5, wherein the wrung-on optical element is fixed against a displacement parallel to the radiation exit side.

7. The optoelectronic component as claimed in claim 2, wherein the optical element is soldered on the radiation exit side.

8. The optoelectronic component as claimed in claim 2, wherein the optical element is adhesively bonded on the radiation exit side.

9. The optoelectronic component as claimed in claim 1, wherein the light-emitting device comprises a laser diode that emits radiation in a wavelength range of less than 460 nm.

10. An optoelectronic component comprising:
   a light-emitting device configured to generate electromagnetic radiation;
   a coupling-out device configured to couple out electromagnetic radiation from the light-emitting device; and
   a reducing device configured to reduce a radiance of the coupled-out electromagnetic radiation, the reducing device arranged on a radiation exit side of the coupling-out device, wherein the coupling-out device has a coupling-out facet and the reducing device comprises an optical element, wherein the optical element is arranged in a manner at least partly covering the radiation exit side, wherein the optical element has a fluid-impermeable protective layer, and wherein the protective layer protects the optical element against a penetration by a fluid.

11. A method for producing an optoelectronic component, the method comprising:
   providing a light-emitting device configured to generate electromagnetic radiation and a coupling-out device configured to couple out electromagnetic radiation; and
   arranging a reducing device on a radiation exit side of the coupling-out device, the reducing device configured to reduce radiance of the coupled-out electromagnetic radiation, wherein the reducing device comprises an optical element, the optical element comprises a fluid-impermeable protective layer, and wherein the protective layer protects the optical element against a penetration by a fluid.

12. The method as claimed in claim 11, wherein the coupling-out device has a coupling-out facet, wherein the optical element is arranged at the radiation exit side of the coupling-out facet to at least partly cover the radiation exit side.

13. The method as claimed in claim 12, wherein arranging the coupling-out device comprises wringing the optical element onto the radiation exit side.

14. The method as claimed in claim 13, wherein wringing comprises:
   applying a fluid to the radiation exit side;
   pressing the optical element onto the radiation exit side with the applied fluid; and
   evaporating the applied fluid, such that during the evaporation the optical element is pulled against the radiation exit side by a capillary force, wherein after the evaporation the optical element is held against the radiation exit side by an atomic force.

15. The method as claimed in claim 14, further comprising, after pressing-on, fixing the optical element against a displacement parallel to a surface of the radiation exit side.

16. The method as claimed in claim 12, wherein the radiation exit side is metallically coated, the method further comprising applying a solder on a surface of the optical element situated opposite the radiation exit side, in order to solder the radiation exit side with the optical element.

17. The method as claimed in claim 12, wherein the optical element is adhesively bonded onto the radiation exit side, and wherein the adhesive bonding comprises at least partly filling a gap between the radiation exit side and the optical element with a curable polymer and subsequently curing the polymer.

18. The method as claimed in claim 12, wherein the optical element has a gas-impermeable protective layer.

* * * * *